United States Patent
Tokiwa et al.

(10) Patent No.: US 7,911,845 B2
(45) Date of Patent: Mar. 22, 2011

(54) NON-VOLATILE SEMICONDUCTOR MEMORY DEVICE

(75) Inventors: Naoya Tokiwa, Fujisawa (JP);
Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 12/350,398

(22) Filed: Jan. 8, 2009

(65) Prior Publication Data
US 2009/0190405 A1 Jul. 30, 2009

(30) Foreign Application Priority Data

Jan. 25, 2008 (JP) ................. 2008-015451

(51) Int. Cl.
*G11C 16/04* (2006.01)
(52) U.S. Cl. ................. 365/185.17
(58) Field of Classification Search ........... 365/185.17
See application file for complete search history.

(56) References Cited

U.S. PATENT DOCUMENTS

| 6,323,681 | B1 * | 11/2001 | Iwanczuk et al. | 326/41 |
| 2002/0194546 | A1 * | 12/2002 | Ooishi | 714/42 |
| 2004/0095809 | A1 * | 5/2004 | Sakamoto et al. | 365/185.29 |

FOREIGN PATENT DOCUMENTS

JP 2007-250187 9/2007
* cited by examiner

*Primary Examiner* — Amir Zarabian
*Assistant Examiner* — Anthan T Tran
(74) *Attorney, Agent, or Firm* — Oblon, Spivak, McClelland, Maier & Neustadt, L.L.P.

(57) ABSTRACT

A non-volatile semiconductor memory device includes: a memory cell array having electrically rewritable and non-volatile memory cells arranged; a data register circuit configured to hold write data to be written into the memory cell array; and an address decode circuit configured to decode a write address signal and control the write data-loading in the data register circuit, the address decode circuit being settable in such a multiple selection mode that the same write data is loaded in multiple registers in the data register circuit in correspondence to multiple addresses.

13 Claims, 11 Drawing Sheets

FIG. 7

| COLADD[12:0] | CD[8:0] | CC[7:0] | CB[7:0] | CA[7:0] |
|---|---|---|---|---|
| 0000h | 0_0001_0001 | 0000_0001 | 0000_0001 | 0000_0001 |
| 0001h | | | | 0000_0010 |
| 0002h | | | | 0000_0100 |
| 0003h | | | | 0000_1000 |
| 0004h | | | | 0001_0000 |
| 0005h | | | | 0010_0000 |
| 0006h | | | | 0100_0000 |
| 0007h | | | | 1000_0000 |
| ~ | | | | |
| 000Fh | | | 0000_0010 | 1000_0000 |
| 0010h | | | 0000_0100 | 0000_0001 |
| ~ | | | | |
| 001Fh | | | 0000_1000 | 1000_0000 |
| 0020h | | | 0001_0000 | 0000_0001 |
| ~ | | | | |
| 003Fh | | 0000_0010 | 1000_0000 | 1000_0000 |
| 0040h | | 0000_0100 | 0000_0001 | 0000_0001 |
| ~ | | | | |
| 007Fh | | 0000_1000 | 1000_0000 | 1000_0000 |
| 0080h | | 0001_0000 | 0000_0001 | 0000_0001 |
| ~ | | | | |
| 00FFh | | 1000_0000 | 1000_0000 | 1000_0000 |
| 0100h | | 0000_0001 | 0000_0001 | 0000_0001 |
| ~ | | | | |
| 01FFh | | 1000_0000 | 1000_0000 | 1000_0000 |
| 0200h | 0_0010_0010 | 0000_0001 | 0000_0001 | 0000_0001 |
| ~ | | | | |
| 07FFh | 0_1000_1000 | 1000_0000 | 1000_0000 | 1000_0000 |
| 1000h | 1_0000_0000 | 0000_0001 | 0000_0001 | 0000_0001 |
| ~ | | | | |
| 103Fh | 1_0000_0000 | 0000_0001 | 0000_0001 | 1000_0000 |

Area 1: 0000h – 07FFh
Area 2: 1000h – 103Fh

NON-VOLATILE SEMICONDUCTOR MEMORY DEVICE

CROSS-REFERENCE TO RELATED APPLICATION

This application is based on and claims the benefit of priority from the prior Japanese Patent Application No. 2008-015451, filed on Jan. 25, 2008, the entire contents of which are incorporated herein by reference.

BACKGROUND OF THE INVENTION

1. Field of the Invention

This invention relates to an electrically rewritable and non-volatile semiconductor memory device, especially relates to an improvement of the write mode.

2. Description of the Related Art

A NAND-type flash memory is well known as one of EEPROMs. In the NAND-type flash memory, data read and write are performed by a page. One page is, for example, formed of a main column area of 4 kByte and a redundant column area of 64 Byte, which are summed up to 4160 Byte. User data are usually input and output Byte by Byte.

In the test of the NAND-type flash memory before shipping, it will be tested whether a predetermined user data is normally written or not (for example, refer to JP-2007-250187A). If test-use write data is supplied to IO pins by one Byte like in a normal write mode, it takes 124.8 μs to load one page test data of 4160 Byte on the assumption that the write cycle is 30 ns.

As described above, it takes a long time to load write test data, and there is a fear that the test time increases in accordance with the page length increase in future.

SUMMARY OF THE INVENTION

According to an aspect of the present invention, there is provided a non-volatile semiconductor memory device including:

a memory cell array having electrically rewritable and non-volatile memory cells arranged;

a data register circuit configured to hold write data to be written into the memory cell array; and an address decode circuit configured to decode a write address signal and control the write data-loading in the data register circuit, the address decode circuit being settable in such a multiple selection mode that the same write data is loaded in multiple registers in the data register circuit in correspondence to multiple addresses.

According to another aspect of the present invention, there is provided a non-volatile semiconductor memory device including:

a memory cell array having electrically rewritable and non-volatile memory cells arranged;

a data register circuit configured to hold read data and write data of the memory cell array; and an address decode circuit configured to decode an address signal, wherein the address decode circuit is set in such a multiple selection mode at a write test time as to make the data register circuit take in the same write data in multiple resisters including one defined by an address signal.

BRIEF DESCRIPTION OF THE DRAWINGS

FIG. 7 is a table showing a pre-decode logic in case of a double selection mode.

DETAILED DESCRIPTION OF THE EMBODIMENTS

Illustrative embodiments of this invention will be explained with reference to the accompanying drawings below.

Figure 1:
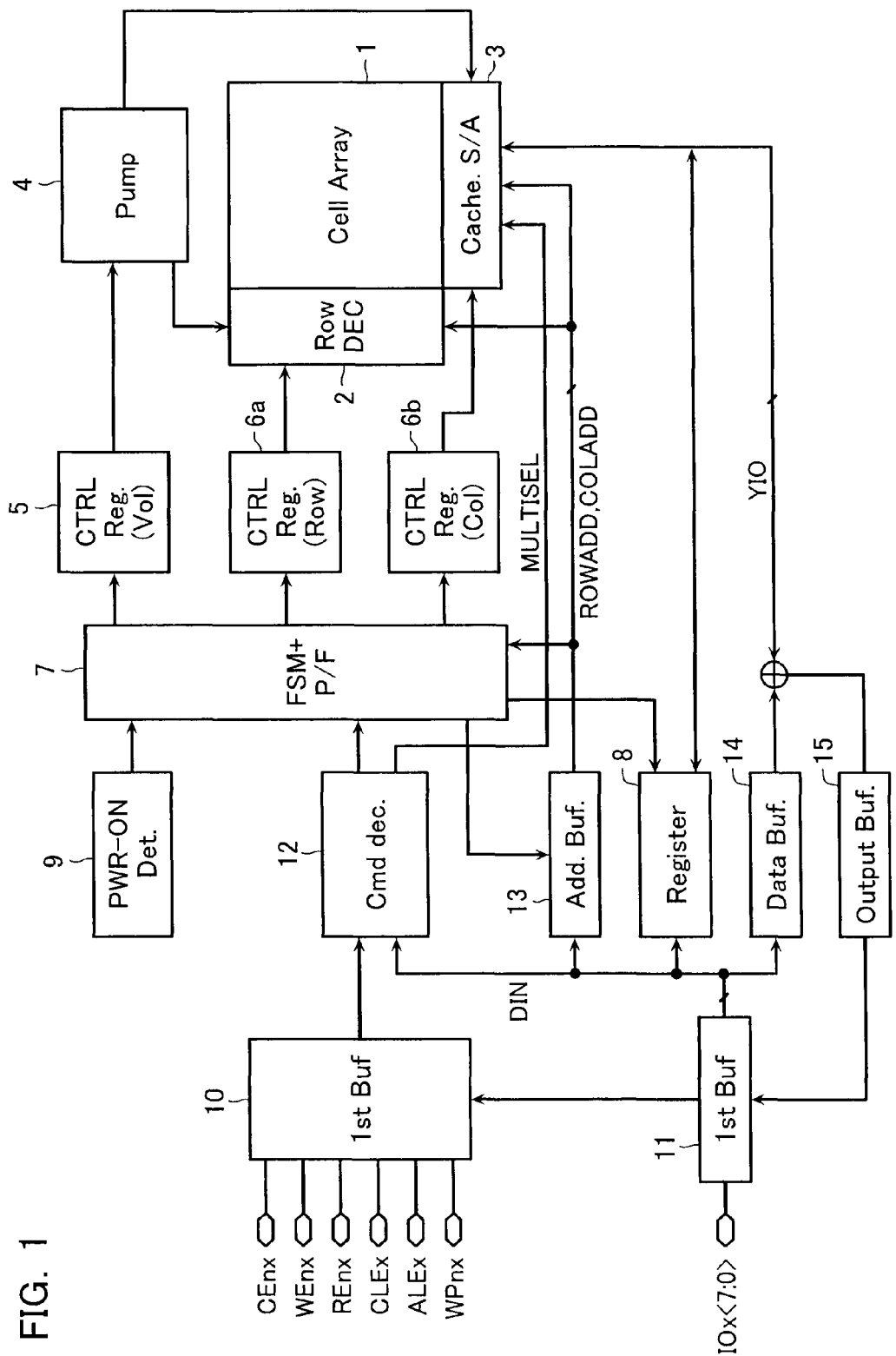
FIG. 1 shows a functional block configuration of a NAND-type flash memory in accordance with an embodiment of the present invention.
Figure 2:
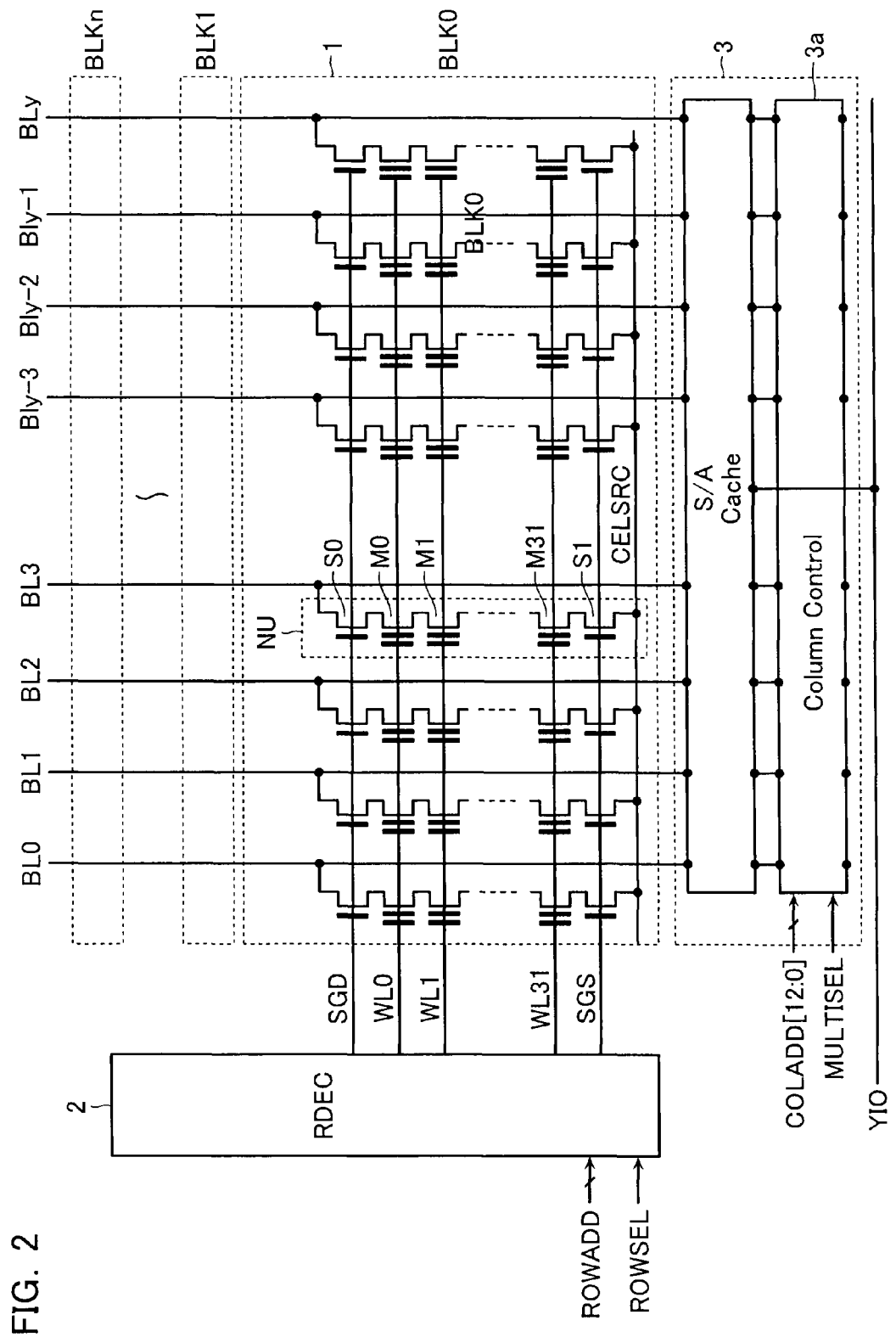
FIG. 2 shows the memory core portion of the flash memory.

FIG. 1 shows a functional block arrangement of a NAND-type flash memory in accordance with an embodiment, and FIG. 2 shows the cell array of the memory core portion. Memory cell array 1 is, as shown in FIG. 2, formed of NAND cell units (i.e., NAND strings) NU arranged, in each of which multiple electrically rewritable and non-volatile memory cells (32 cells in this case), M0-M31, are connected in series.

One end of the NAND cell unit NU is coupled to bit line BLi via select gate transistor S0 while the other end is coupled to common source line CELSRC via select gate transistor S1. Control gates of the memory cells are coupled to word lines WL0-WL31; and gates of the select gate transistors S0 and S1 to select gate lines SGD and SGS, respectively.

A set of NAND cell units arranged in the word line direction is defined as a block, which serves as a data erase unit. As shown in FIG. 2, multiple blocks, BLK0-BLKn, are arranged along the bit line BLi. Disposed at one end of the bit line BLi is sense amplifier circuit 3, which contains data register circuits. Column address decode circuit 3a is attached to the sense amplifier circuit 3 for column selecting. Disposed at one end side of the word lines is row decoder 2, which selectively drives the word lines and select gate lines.

Command, address and data are input through input buffer 11 while external control signals such as chip enable signal CEnx, write enable signal WEnx, read enable signal REn and the like are input through input buffer 10. Command will be decoded in command decoder 12 and sent to state machine 7 serving as an internal control circuit.

Address will be input through address buffer 13 and transferred to row decoder 2 and column decoder 3a together with the outputs of control registers 6a and 6b at predetermined timings under the control of state machine 7. Here, the input address is divided into row address ROWADD and column address COLADD, which are input to the respective decode portions. It should be noted that column address COLADD may be generated from a column address counter.

Register circuit 8 is prepared for storing voltage trimming data and the like read out from a ROM area in the cell array 1 in a power-on reset operation. Write data are loaded in the sense amplifier circuit 3 via data buffer 14, and read data are output externally via data buffer 15.

There is prepared high voltage generating circuit 4 for generating various high voltages required in association with operation modes. The voltage generating circuit 4 generates a high voltage based on an instruction supplied from the state machine 7 via control register 5.

In this embodiment, multiple selection signal, MULTISEL, with logic level "H", which is a command decode signal instructing a high-speed data load operation, will be input to the sense amplifier circuit 3 in a write test mode. This signal MULTISEL is set at "L" in the remaining usual operation modes such as a user's data write mode.

Figure 3:
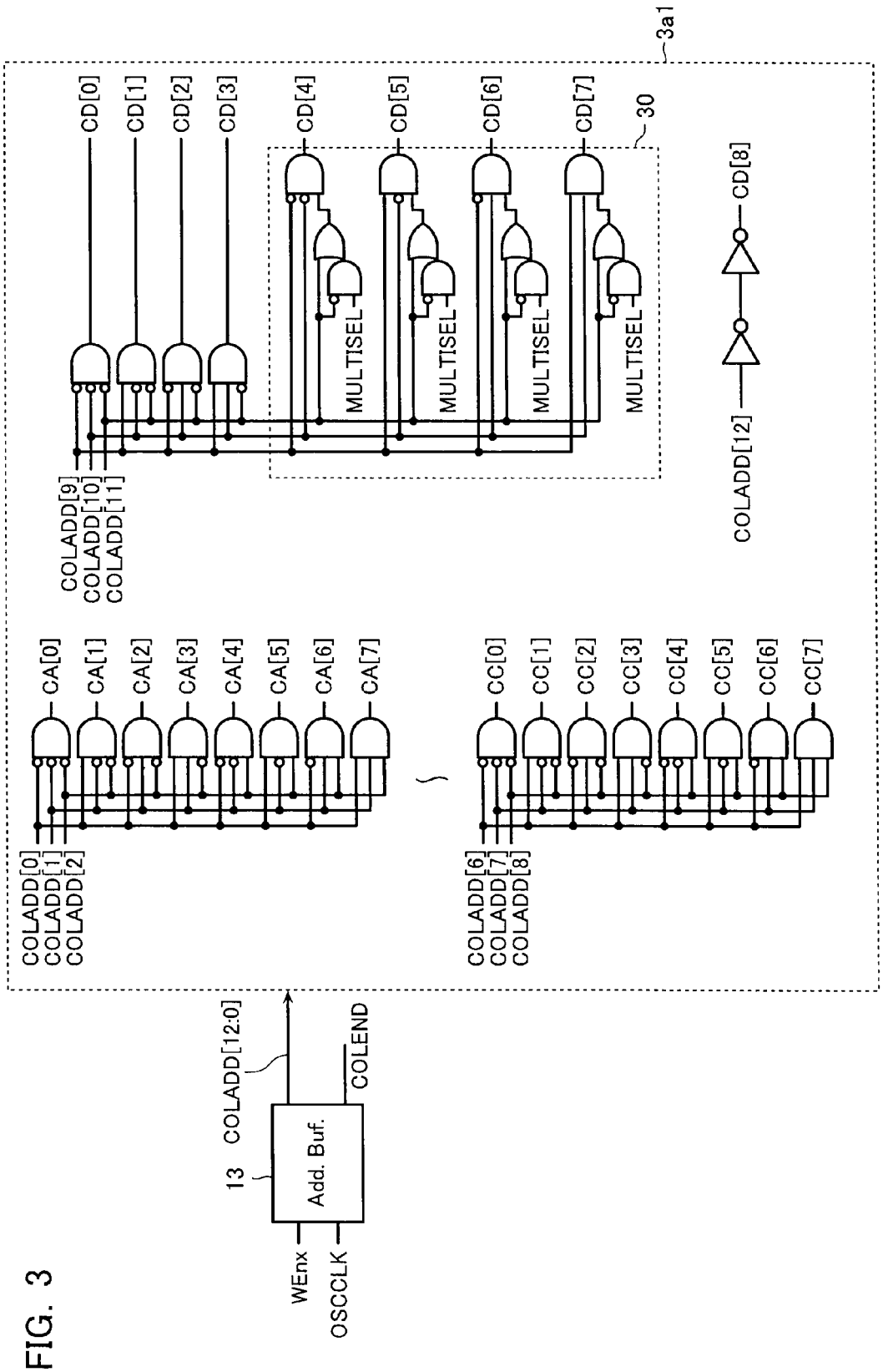
FIG. 3 shows the column pre-decoder of the flash memory.

FIG. 3 shows the logic of column address decoding in this embodiment.

Address buffer 13 has a counter (not shown) for performing a counting operation synchronously with write enable signal WEnx, or clock signal OSCCLK that is an internal clock generated in the flash memory. The outputs of address buffer 13 constitute column address signal COLADD[12:0] of 13 bits, which are used for accessing one page of 4160 Byte defined as a simultaneously written area.

This column address signal COLADD is decoded in the pre-decoder 3a1 in the column address decode circuit 3a to multiple one-hot signals, CA[7:0], CB[7:0], CC[7:0] and CD[8]. Pre-decoder 3a1 includes gate circuit 30, which selectively sets a "multiple selection mode" for loading the same write data in multiple addresses including one defined by an address signal.

Figure 4:
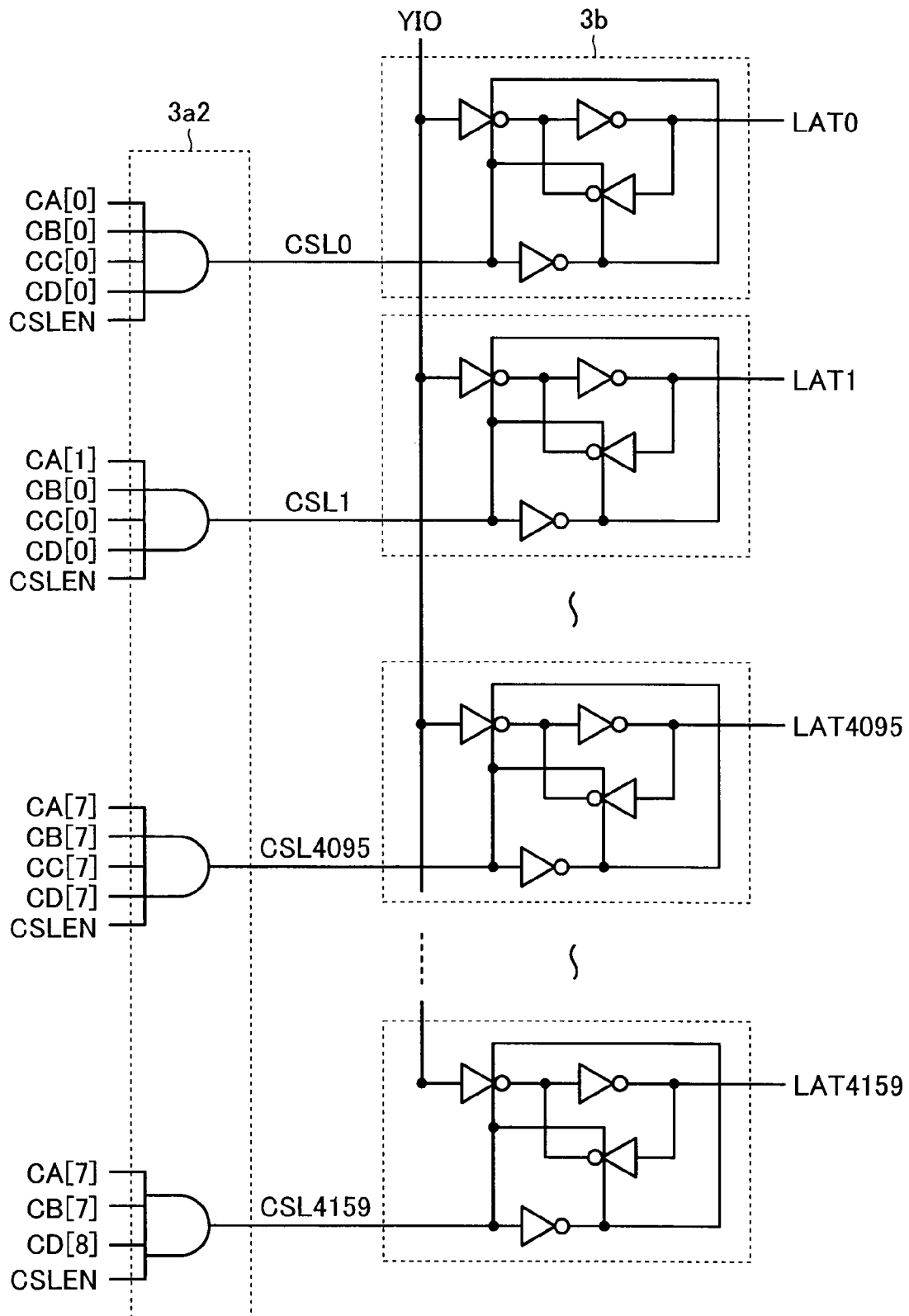
FIG. 4 shows the column address decoder and data cache portions of the flash memory.

As shown in FIG. 4, main decoder 3a2 generates allowing signals for allowing data latching, CSL0-CSL4159, of data registers (i.e., caches) 3b in the sense amplifier circuit 3 in accordance with the pre-decoded signals. That is, only an address position directed by the column address COLADD [12:0], i.e., only such a portion that AND is concluded in the pre-decoded signals CA, CB, CC and CD and signal CSLEN that determines the data loading timing, the allowing signal becomes "H", so that write data on the data line YIO will be loaded in a latch.

Figure 5:
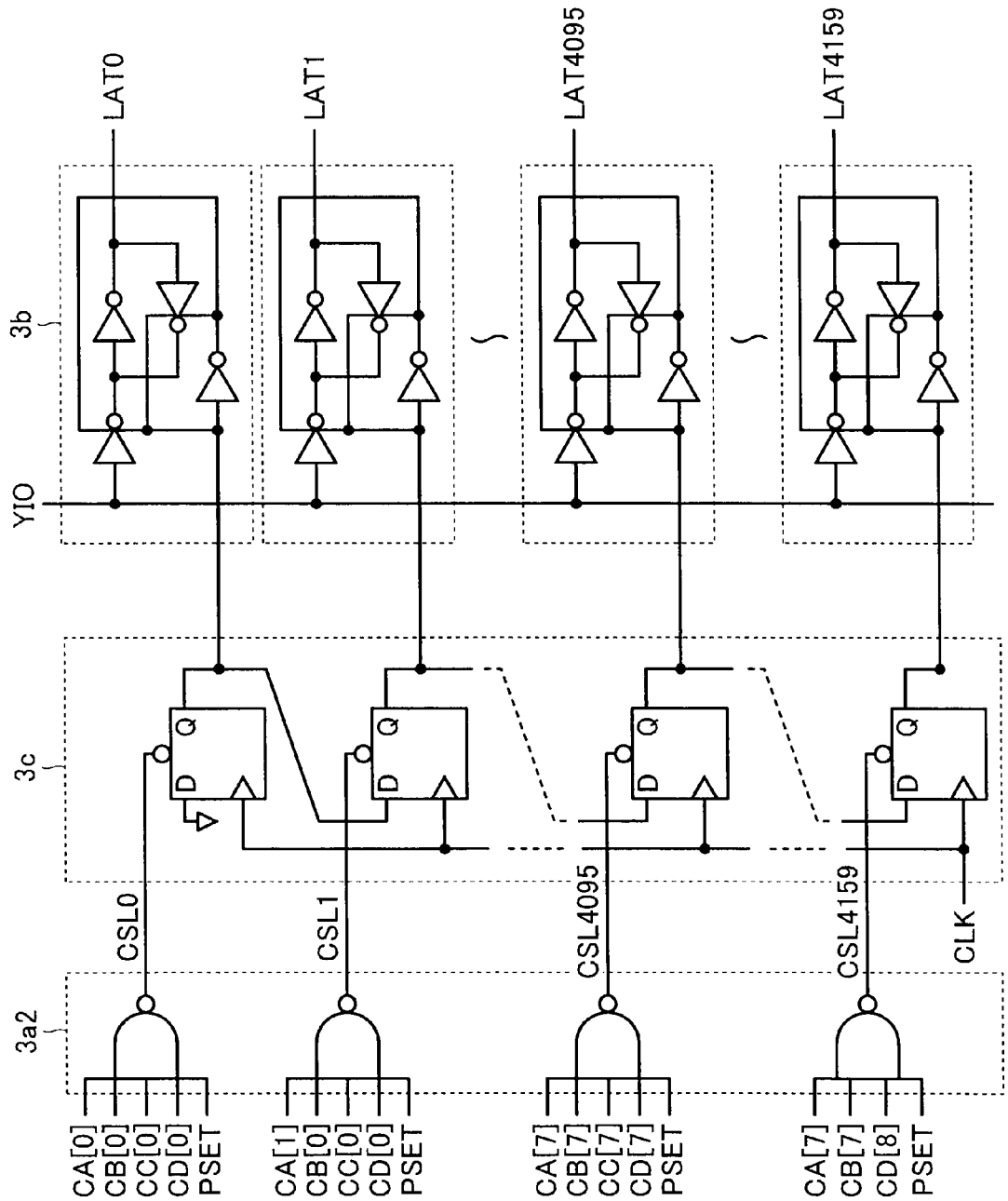
FIG. 5 shows an example, in which a shift register is disposed between the column address decoder and the data cache.

FIG. 5 shows an example, in which shift register 3c is disposed between the column address decoder (3a1, 3a2) and the data register 3b. In the shift register 3c, such a register portion that AND is concluded in the pre-decoded signals CA, CB, CC and CD and timing signal PSET is set asynchronously, and the shift register 3c is activated sequentially with clock signal CLK generated based on the write enable signal WEnx, so that data on the data line YIO are latched sequentially.

Figure 6:
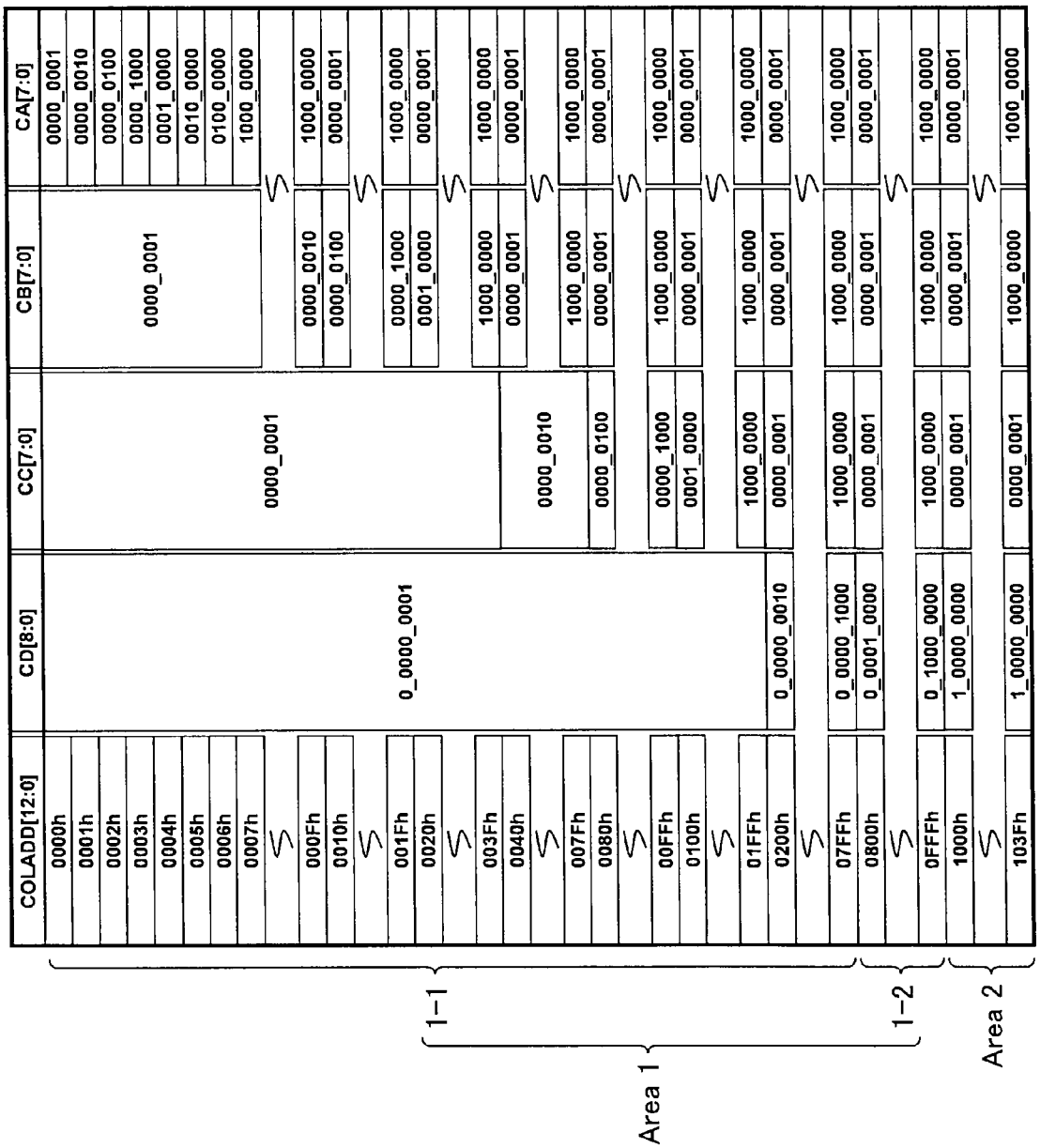
FIG. 6 is a table showing a pre-decode logic without multiple selection.

When a user loads usual write data, the multiple selection mode is not set, i.e., the multiple selection signal MULTISEL is kept at "L". The selection logic will be expressed by the pre-decoded signals as shown in FIG. 6. In this case, only an address directed by the column address signal COLADD[12:0] is selected, i.e., only 1 Byte will be selected in a page.

On the other hand, when loading test-use write data at a high speed in a test mode, the multiple selection mode is set (i.e., the multiple selection signal MULTISEL is set at "H"). In this case, the selection logic will be expressed by the pre-decoded signals as shown in FIG. 7. That is, as shown in FIG. 3, when MULTISEL is "H", gate circuit 30 is activated, so that CD[0] and CD[4] are selected simultaneously, and CD[1] and CD[5]; CD[2] and CD6]; and CD[3] and CD[7] are also selected simultaneously.

In this embodiment, the number of columns simultaneously selected at a test time is 2. That is, when address 0 is selected, address 2048 is also selected simultaneously. It should be noted that the number of simultaneously selected columns may be set at another certain power of 2 such as 4, 8 and so on in accordance with the construction scheme of the pre-decoder circuit 3a1.

In a normal NAND-type flash memory, one page (i.e., page length) is formed of a main column area (area 1) expressed by a power of 2 and redundant column area (area 2) of some Bytes. For example, area 1 is of 4096 Byte; and area 2 of 64 Byte, the sum of which is 4160 Byte. Note here that the redundant area 2 may be formed in different schemes in accordance with the address signal constitution and the physical construction of the column. Further, for the purpose of making the circuit simple, such a case often occurs that pre-decoded signals CA, CB, CC and CD are not used in its entirety.

In this embodiment, CD[8]=1 instructs to select area 2. Since 64 Byte of area 2 may be expressed by only CD[8], CA[7:0] and CB[7:0], there is no need of inputting CC signal for the main column decoder 32a. Therefore, there is such a case that signal input may be omitted. In this case, there is a fear that multiple data load operations are generated unexpectedly due to the simultaneously selected numbers or the selection method.

As described above, in this embodiment, one page is divided logically into area 1 expressed by a power of 2 and redundant area 2, and in a high-speed data load mode, the data load method of area 1 and that of area 2 are set to be different from each other.

The details will be explained as follows. In such a case that the number of simultaneously selected columns is 2, and the column length is 4160, as shown in FIG. 6, two areas are set logically as follows: area 1 defined by address 0 (i.e., 0000h) to address 4095 (i.e., 0FFFh); and area 2 defined by address 4096 (i.e., 1000h) to address 4159 (i.e., 103Fh). Additionally, the area 1 is further divided into two multiple selection areas 1-1 and 1-2, the former being defined by address 0 to address 2047 (i.e., 07FFh); and the latter by address 2048 to address 4095 (i.e., 0FFFh). Data load operations are performed simultaneously for these two multiple selection areas 1-1 and 1-2.

According to this embodiment, performing 2048 data load operations, the whole data load will be finished for the area defined by address 0 to address 4096. Then, set the column address at address 4096 in accordance with the instruction of state machine 7, and load data in the area 2 up to address 4159 without the multiple selection. It should be noted that another multiple selection method different from one used for area 1 may be used for this area 2 for the purpose of increasing the data loading speed.

Figure 8:
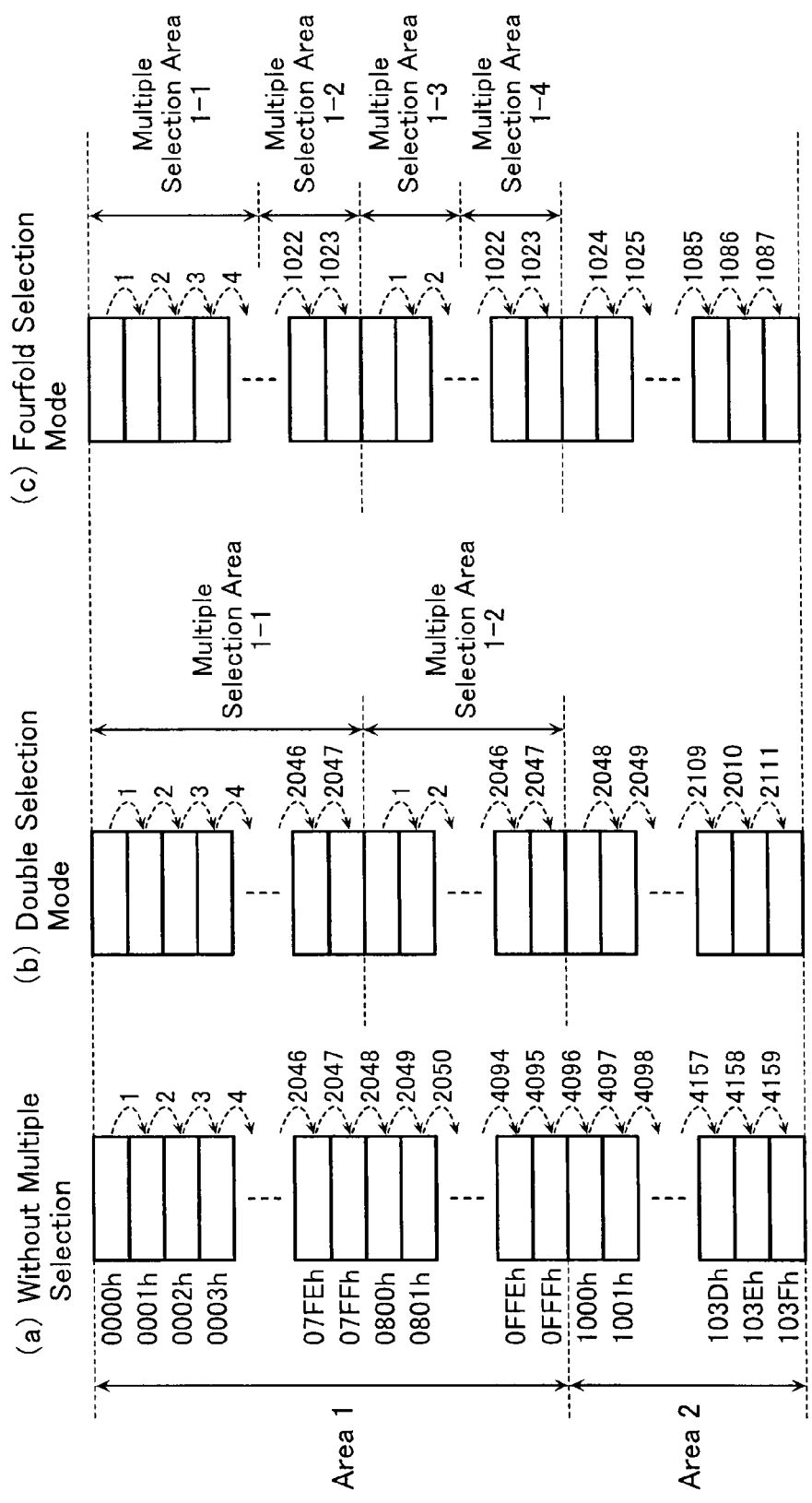
FIG. 8 is a diagram for showing the multiple selection modes in comparison with the case without multiple selections.

FIG. 8 is a diagram for explaining the multiple selection modes in this embodiment. Shown in comparison with a normal data load (a) without multiple selections are double selection mode (b) and fourfold selection mode (c) in accordance with this embodiment. In the double selection mode (b), the first data load is performed at address 0 and address 2048 simultaneously; the second data load is performed at address 1 and address 2049 simultaneously; the same double selections as described above are followed hereinafter; and finally data load at address 2049 is performed simultaneously with that at address 4096.

In the fourfold selection mode (c), the main column area 1 is divided into four multiple selection areas 1-1 to 1-4, from which four address data are loaded simultaneously. It is requited of the number of these multiple selections to be set at a suitable value in accordance with the data bus drivability, the data input cycle and the like.

According to this embodiment, in the double selection mode, test data loading will be completed in about the half time length, 62.4 µs, for area 1 in comparison with the conventional data load time 124.8 µs. Specifically, it is effective for such a test process that it is in need of data-loading with a small data pattern. According to this, it becomes possible to reduce the test time and the test cost of a NAND-flash memory device.

As an embodiment, an electric card using the non-volatile semiconductor memory devices according to the above-described embodiment of the present invention and an electric device using the card will be described bellow.

Figure 9:
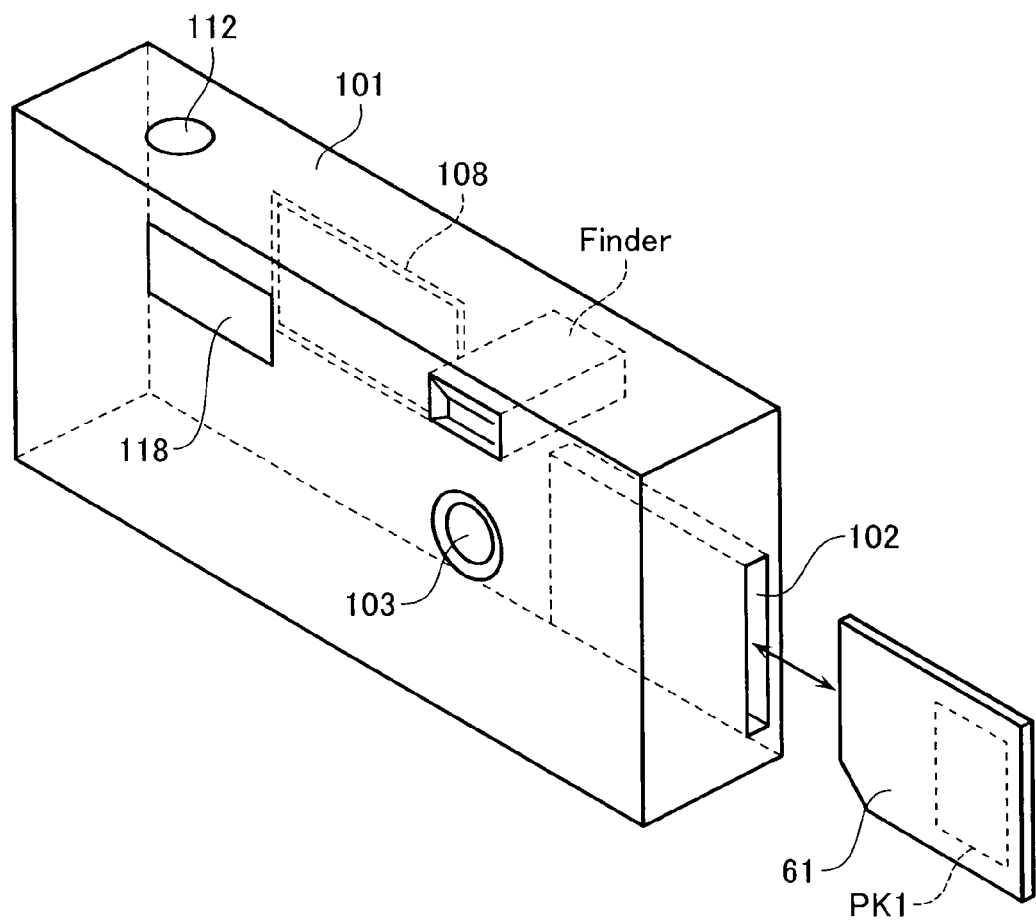
FIG. 9 shows another embodiment applied to a digital still camera.

FIG. 9 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 10:
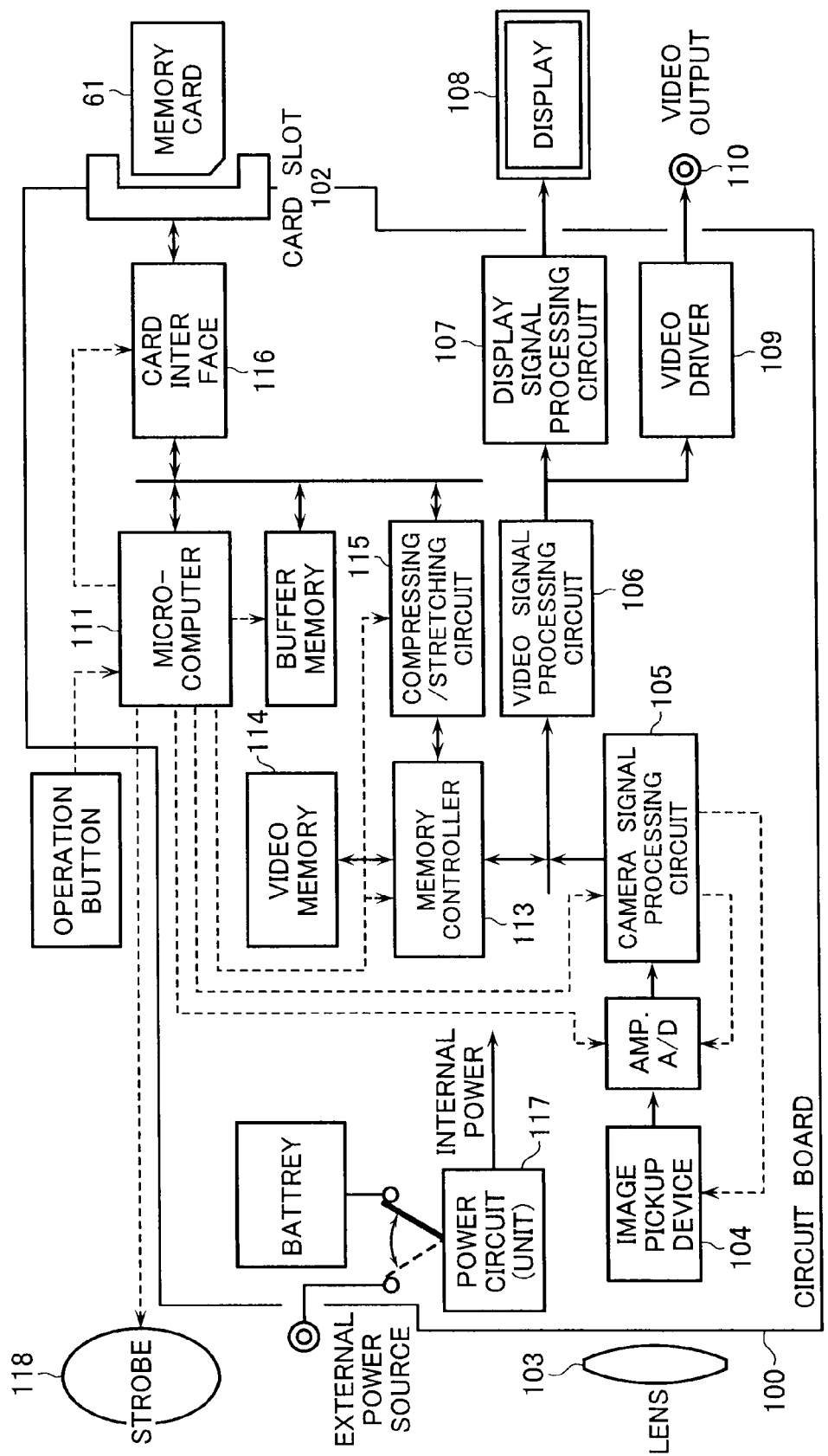
FIG. 10 shows the internal configuration of the digital still camera.
Figure 11A:
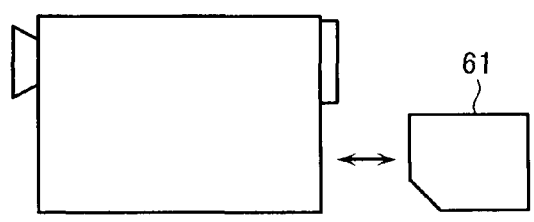
FIGS. 11A to 11J show other electric devices to which the embodiment is applied.
Figure 11F:
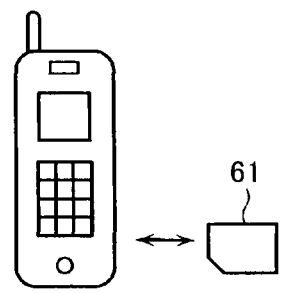
Figure 11B:
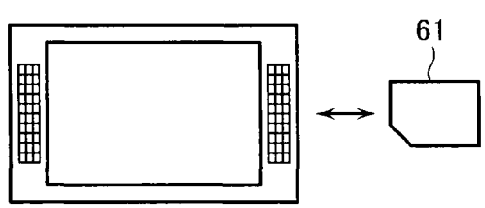
Figure 11G:
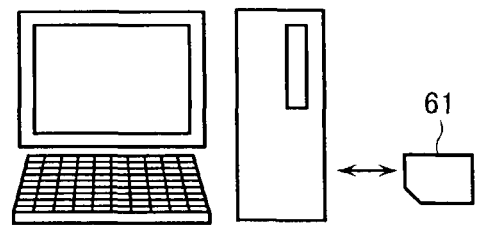
Figure 11C:
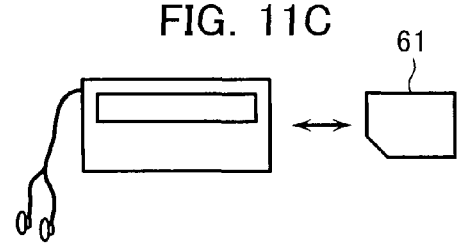
Figure 11H:
Figure 11D:
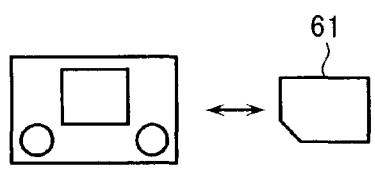
Figure 11I:
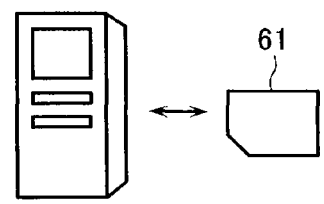
Figure 11E:
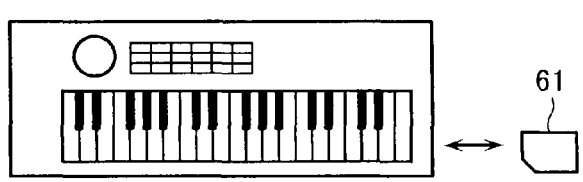
Figure 11J:
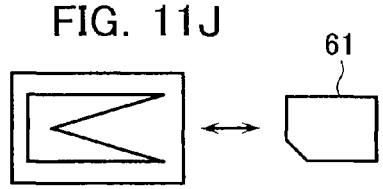

FIG. 10 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 11A to 11J, as well as in portable electric devices. That is, the electric card can also be used in a video camera shown in FIG. 11A, a television set shown in FIG. 11B, an audio apparatus shown in FIG. 11C, a game apparatus shown in FIG. 11D, an electric musical instrument shown in FIG. 11E, a cell phone shown in FIG. 11F, a personal computer shown in FIG. 11G, a personal digital assistant (PDA) shown in FIG. 11H, a voice recorder shown in FIG. 11, and a PC card shown in FIG. 11J.

This invention is not limited to the above-described embodiment. For example, this invention is adaptable to not only a NOR-type flash memory but also other non-volatile semiconductor memory devices such a resistance change memory device, in which a resistance value is stored in a non0volatile manner, and the like.

Further, it will be understood by those skilled in the art that various changes in form and detail may be made without departing from the spirit, scope, and teaching of the invention.

What is claimed is:

1. A non-volatile semiconductor memory device comprising:
    a memory cell array having electrically rewritable and non-volatile memory cells arranged;
    a data register circuit configured to hold write data to be written into the memory cell array; and
    an address decode circuit configured to decode a write address signal and control the write data-loading in the data register circuit, the address decode circuit being settable in such a multiple selection mode that the same write data is loaded in multiple registers in the data register circuit in correspondence to multiple addresses, wherein
    the memory cell array has a plurality of pages, each page is defined as a simultaneously written range in the memory cell array, each page has a first area, the address of which is expressed by a power of 2, and an additional second area different from the first area, each of the areas is to be data loaded, and wherein the multiple selection mode of the address decode circuit is set with regard to write data loading only in the first area.

2. The non-volatile semiconductor memory device according to claim 1, wherein
the multiple selection mode of the address decode circuit is set in accordance with a command.

3. The non-volatile semiconductor memory device according to claim 1, wherein
the address decode circuit is a column address decode circuit used for column-selecting in the page, and wherein
the column address decode circuit comprises:
a pre-decoder configured to decode a column address signal;
a main decoder configured to further decode the pre-decoded signals of the pre-decoder; and
a gate circuit attached in the pre-decoder to selectively set the multiple selection mode, in which multiple pre-decoded signals are activated simultaneously, in accordance with a multiple selection signal generated based on a command.

4. The non-volatile semiconductor memory device according to claim 1, further comprising:
a shift register arranged between the address decode circuit and the data register circuit in correspondence with the register to be data loaded in the data register circuit, wherein
the shift register configured to activate the data latching of the respective registers in the data register circuit, the data of the shift register being set in accordance with the decode output of the address decode circuit.

5. The non-volatile semiconductor memory device according to claim 1, wherein
the multiple selection mode is set in accordance with a command in a test mode, in which test data are written in the memory cell array.

6. The non-volatile semiconductor memory device according to claim 1, wherein
the memory cell array includes NAND cell units arranged therein, each NAND cell unit having a plurality of the memory cells connected in series.

7. The non-volatile semiconductor memory device according to claim 1, wherein
another multiple selection mode of the address decode circuit different from the multiple selection mode for the first area is set with regard to write data loading in the second area.

8. A non-volatile semiconductor memory device comprising:
a memory cell array having electrically rewritable and non-volatile memory cells arranged;
a data register circuit configured to hold read data and write data of the memory cell array; and
an address decode circuit configured to decode an address signal, wherein the address decode circuit is set in such a multiple selection mode at a write test time as to make the data register circuit take in the same write data in multiple resisters including one defined by an address signal, wherein
the memory cell array has a plurality of pages, each page is defined as a simultaneously written range in the memory cell array, the page has a first area, the address of which is expressed by a power of 2, and an additional second area different from the first area, each of the areas is to be data loaded, and wherein
the multiple selection mode of the address decode circuit is set with regard to write data loading only in the first area.

9. The non-volatile semiconductor memory device according to claim 8, wherein
the multiple selection mode of the address decode circuit is set in accordance with a command.

10. The non-volatile semiconductor memory device according to claim 8, wherein
the address decode circuit is a column address decode circuit used for column-selecting in the page and wherein
the column address decode circuit comprises:
a pre-decoder configured to decode a column address signal;
a main decoder configured to further decode the pre-decoded signals of the pre-decoder; and
a gate circuit attached in the pre-decoder to selectively set the multiple selection mode, in which multiple pre-decoded signals are activated simultaneously, in accordance with a multiple selection signal generated based on a command.

11. The non-volatile semiconductor memory device according to claim 8, further comprising:
a shift register being arranged between the address decode circuit and the data register circuit in correspondence with the register to be data loaded in the data register circuit, wherein
the shift register configured to activate the data latching of the respective registers in the data register circuit, the data of the shift register being set in accordance with the decode output of the address decode circuit.

12. The non-volatile semiconductor memory device according to claim 8, wherein
the memory cell array includes NAND cell units arranged therein, each NAND cell unit having a plurality of the memory cells connected in series.

13. The non-volatile semiconductor memory device according to claim 8, wherein
another multiple selection mode of the address decode circuit different from the multiples selection mode for the first area is set with regard to write data loading in the second area.

* * * * *